United States Patent [19]
Eul

[11] Patent Number: 5,715,530
[45] Date of Patent: Feb. 3, 1998

[54] METHOD FOR REDUCING SPURIOUS RECEPTION LOCATIONS IN HOMODYNE RECEIVERS WITH TIME-VARIANT CARRIER FREQUENCY

[75] Inventor: Hermann-Josef Eul, Oberschleissheim, Germany

[73] Assignee: Siemens Aktiengesellschaft, Munich, Germany

[21] Appl. No.: 683,759

[22] Filed: Jul. 17, 1996

[30] Foreign Application Priority Data

Jul. 18, 1995 [DE] Germany ............... 195 26 171.2

[51] Int. Cl.$^6$ .................................... H04B 1/10
[52] U.S. Cl. ................... 455/306; 455/310; 455/317; 455/318; 455/324; 327/355
[58] Field of Search .......................... 455/324, 314, 455/302, 303, 304, 306, 310, 205, 209, 315, 318, 338, 296, 317; 327/105, 355, 362, 551, 552, 557

[56] References Cited

U.S. PATENT DOCUMENTS 4,363,139  12/1982  Sullivan, Jr. ................... 455/324

FOREIGN PATENT DOCUMENTS 37 84 930 T2  3/1993  Germany.
WO 93/14578  7/1993  WIPO.

OTHER PUBLICATIONS

Patent Abstract of Japan, E-1487 Jan. 10, 1994, vol. 18, No. 10, Frequency Converter, JP 05-251937, dated 28 Sep. 1993.

H.J. Eul et al. Etablierung der Komplexen Messfaehigkeit Eines Homodynen Reflektometers Durch Unbekannte Standards Mit Hilfe Der Moebius-Transformation, (1989), vol. 33, pp. 1–12.

*Primary Examiner*—Andrew Faile
*Assistant Examiner*—Christopher Onuaku
*Attorney, Agent, or Firm*—Hill, Steadman & Simpson

[57] ABSTRACT

In a homodyne receiver for the reception of a carrier frequency signal with time-variant carrier frequency, an auxiliary signal is modulated onto the local oscillator signal selected corresponding to the current carrier frequency. A better separation of the local oscillator signals is thereby achieved by a band-pass filtering after the conversion of the carrier frequency signal into the base band. Compared to a homodyne receiver with time-variant carrier frequency but without auxiliary modulation, the RF switch for the selection of the local oscillator signal corresponding to the current carrier frequency can be realized simple and more economical. This advantage of the homodyne receiver is of particular economic significance for employment in mass-produced articles, such as in mobile and wireless communication systems.

20 Claims, 3 Drawing Sheets

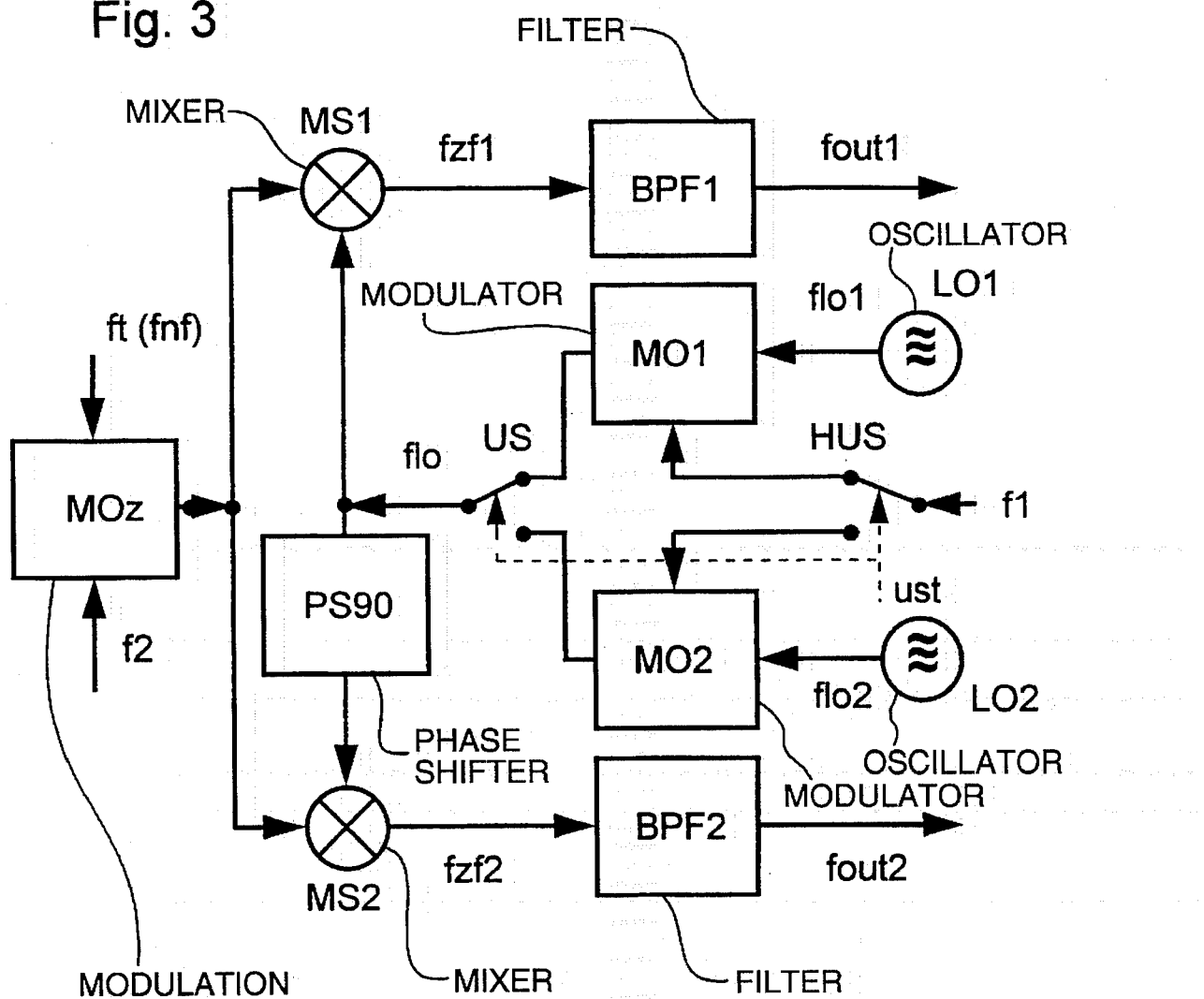

METHOD FOR REDUCING SPURIOUS RECEPTION LOCATIONS IN HOMODYNE RECEIVERS WITH TIME-VARIANT CARRIER FREQUENCY

BACKGROUND OF THE INVENTION

What is generally understood as homodyne receivers is the part of a radio receiver wherein a received carrier frequency signal is converted into an intermediate frequency signal whose intermediate frequency is equal to zero, being converted by a mixing with a suitably selected oscillator signal. An oscillator signal that comprises a frequency corresponding to the carrier frequency of the received carrier frequency signal must be locally generated in the homodyne receiver for generating an intermediate frequency signal having the frequency zero. The low-frequency signal contained in the carrier frequency signal is thus directly available for further evaluation in the following devices belonging to the radio receiver. For example, this evaluation is comprised in the sampling and recovery of the low-frequency signal. The low-frequency signal can only be evaluated according to one component or according to both, i.e. the in-phase and the quadrature component, in the homodyne receiver. Such homodyne receivers are well-known, for example from the Kleinheubacher Berichten 1989, Volume 33, "Etablierung der komplexen Messfähigkeit eines homodynen Reflektometers durch unbekannte Standards mit Hilfe der Möbius-Transformation" by H. J. Eul, B. Schiek.

When the principle of the homodyne receiver is to be expanded to the reception of a carrier frequency signal with a carrier frequency that is variable over time, then the local oscillator signal must also be time-variable. Either the local oscillator signal must be able to switch quickly between the frequencies (difficult to realize) or a plurality of local oscillators between which switching is carried out are required. Given switching, the problem arises that an RF-switch must switch rapidly and disturbance-free between the various oscillator signals. This means high technological demands made of the RF switch and, thus, high economic outlay for the realization.

Time-variant carrier frequencies are also known from mobile radiotelephone systems according to the GSM standard. The transmitter informs the reception equipment of the new carrier frequency and the point in time of the change before the change of the carrier frequency. The reception equipment can thus tune a further local oscillator to the new carrier frequency and switch to the local oscillator signal generated thereat at the proper point in time.

In previously known homodyne receivers with time-variant carrier frequency, there is the technological difficulty of fashioning the switchover means that switches the high-frequency oscillator frequencies such that it can separate the high-frequency signals without spurious unwanted location reception. Spurious location reception occurs when the oscillator signal, due to deficient switching or disturbances, also contains further signal parts, for example those of the previously used local oscillator signal, in addition to the signal parts that are to be allocated to the carrier frequency. Complicated shieldings or qualitatively high-grade switchover means that are thus complicated to manufacture are necessary in order to reduce the spurious location reception and to thus avoid a blocking and desensitization of the homodyne receiver.

SUMMARY OF THE INVENTION

It is an object of the present invention to provide a method for reducing spurious reception locations in homodyne receivers with time-variant carrier frequency that can be realized with simple and economic means.

In general terms the present invention is a method for reducing spurious reception locations in homodyne receivers with time-variant carrier frequency. A received carrier frequency signal with a time-variant carrier frequency modulated with a low-frequency signal is mixed with an oscillator signal that can be allocated to the current carrier frequency and that is derived from a local oscillator signal to form a first intermediate frequency signal. A local oscillator signal for the derivation of the oscillator signal is selected by switch means. The frequency of the selected local oscillator signal corresponds to the current carrier frequency of the carrier frequency signal. The oscillator signal is derived by modulation of the selected local oscillator signal with an auxiliary signal. The first intermediate frequency signal is band-pass filtered corresponding to a frequency allocated to the auxiliary signal.

Advantageous developments of the present invention are as follows.

The carrier frequency signal is mixed with the oscillator signal that can be allocated to the current carrier frequency and that is phase-shifted by 90° to form a second intermediate frequency signal. The second intermediate frequency signal is band-pass filtered corresponding to a frequency allocated to the auxiliary signal.

The auxiliary signal for the modulation of the selected local oscillator signal is connected in with additional switch means synchronously with the selection of the local oscillator signal.

The band-filtering of the first and second intermediate frequency signal is respectively tuned to the frequency of the auxiliary signal.

The carrier frequency signal is modulated with a supplemental signal before the mixing and the band-filtering of the at least one intermediate frequency signal is respectively tuned to the frequency difference between the frequencies of the supplemental signal and of the auxiliary signal.

The frequency of the auxiliary signal lying between the frequencies of the low-frequency signal and of the carrier frequency signal is tuned to a frequency at which economically realizable switchovers and band-filters can be utilized.

The frequency of the supplemental signal is selected such that the level of the frequency difference is lower than the frequency of the supplemental signal and the frequency of the auxiliary signal and corresponds to no frequency generated in the homodyne receiver.

In general terms the present invention is also a homodyne receiver for reducing spurious reception locations in the reception of a carrier frequency signal with time-variant carrier frequency modulated with a low-frequency signal. Two mixer stages that have their input side respectively connected to the input of the homodyne receiver and to a switchover either directly or, respectively, via a 90° phase shifter. The switchover controlled by a control signal selects a local oscillator generating a local oscillator signal corresponding to the carrier frequency of the carrier frequency signal for connection to the first mixer stage and to the 90° phase shifter. The carrier frequency signal is mixed in the first mixer stage with an oscillator signal allocatable to the respective carrier frequency and, thus, one of the local oscillator signals. It is mixed in the second mixer stage with the oscillator signal shifted by 90° in the 90° phase shifter to respectively form an intermediate frequency signal pending at the respective output of the mixer stages. The switchover is connected to each local oscillator via a respective modulator for the modulation of the local oscillator signal corresponding to the current carrier frequency with an auxiliary signal to form the oscillator signal. The auxiliary signal is supplied via an additional auxiliary switchover to the modulator that is connected to the switchover at this time. The output of the first mixer stage is connected to the input of a first band-pass filter and the output of the second mixer stage is connected to the input of a second band-pass filter. The band-pass filters are respectively tuned corresponding to a frequency allocatable to the auxiliary signal such that a signal proportional to the real part of the low-frequency signal pends at the output of the first band-pass filter a signal proportional to the imaginary part of the low-frequency signal pends at the output of the second band-pass filter.

Advantageous developments of the present invention are as follows.

The auxiliary signal for the modulation of the allocated local oscillator signal is connected by the auxiliary switchover that is synchronously controlled by the control signal with the selection of the local oscillator signal.

The band-pass filters for the band-filtering of the first and second intermediate frequency signal are tuned to the frequency of the auxiliary signal.

The input of the homodyne radio receiver corresponds to the output of an additional modulator in the homodyne radio receiver. The carrier frequency signal is modulated with a supplemental signal before the mixing in the mixer stages. The band-pass filters for the band-filtering of the first and second intermediate frequency signal are tuned to the frequency difference between the frequencies of the supplemental signal and of the auxiliary signal.

The frequency of the auxiliary signal between the frequencies of the low-frequency signal and of the carrier frequency signal is defined in a frequency range of modulators and band-pass filters that can be simply and cost-beneficially realized.

The frequencies of the auxiliary signal and of the supplemental signal are selected such that the level of the frequency difference is lower than the frequency of the supplemental signal and the frequency of the auxiliary signal. The frequency difference does not correspond to any other frequency part generated in the homodyne receiver. The switchover is fashioned as a two-stage switchover. The switchover selects between two local oscillators connected to the switchover via a respective modulator. The selected local oscillator generates the current carrier frequency and the other local oscillator is tuned to the next-successive carrier frequency.

An important aspect of the present invention is in use of an additional auxiliary signal with a frequency that can be governed technologically and with little economic outlay. Before the mixing, this auxiliary signal is modulated onto the local oscillator signal and enables a better separation of the local oscillator signals. Only the selected local oscillator signal is modulated with the auxiliary signal and the received low-frequency signal is filtered of noise components as amplitude of the auxiliary signal by a band-pass filtering after the mixing of the carrier frequency signal with the oscillator signal. The spurious location reception is thus reduced or entirely avoided.

The switch means for the selection of the local oscillator signal corresponding to the current carrier frequency can thus be fashioned more simply and economically since the switch means alone no longer separates the local oscillator signals. This consideration is of particular economic significance for employment in mass-produced articles such as in mobile and wireless communication systems.

Advantageously, the received low-frequency signal is completely evaluated, that is both according to in-phase components as well as according to quadrature components, and the carrier frequency signal is additional mixed with the 90° phase-shifted oscillator signal allocatable to the current carrier frequency to form a second intermediate frequency signal. The second intermediate frequency signal is band-pass filtered corresponding to a frequency allocated to the auxiliary signal.

The cut-in of the auxiliary signal for the modulation of the selected local oscillator signal with an additional switch means is synchronously implemented with the selection of the local oscillator signal by the switch means for the high frequency. According to this advantageous development, the same control signal can be used for both switch means.

In the simplest realization of the inventive method, the band-filtering of the first and second intermediate frequency signal is respectively tuned to the frequency of the auxiliary signal. The separation of the received, low-frequency signal from further undesired frequency parts can thus be realized with an economically and simply realized band-pass filter.

According to another advantageous development of the inventive method, the carrier frequency signal is modulated with a supplemental signal before the mixing. A band-pass filter respectively tuned to the frequency difference between the frequencies of the auxiliary signal and the supplemental signal is utilized for the band-pass filtering of the intermediate frequency signal. A signal is that has a frequency with the difference between the frequencies of the supplemental signal and the auxiliary signal is thus selected by the band-pass filtering from the plurality of frequency parts that are present after the mixing. A highly sensitive receiver can be designed by suitable selection of said frequencies since the frequency that is filtered out is largely independent of the frequency parts generated in the reception means and is not subject to any disturbing influences.

The frequency of the auxiliary signal can thereby lie between the frequencies of the low-frequency signal and of the carrier frequency signal, so that switchover means and band-pass filters economically realizable for this frequency can be utilized.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 3 is a block circuit diagram of a homodyne receiver with two-fold auxiliary modulation for the reception of the in-phase and quadrature components of a carrier frequency signal with time-variant carrier frequency.

DESCRIPTION OF THE PREFERRED EMBODIMENTS

Figure 1:
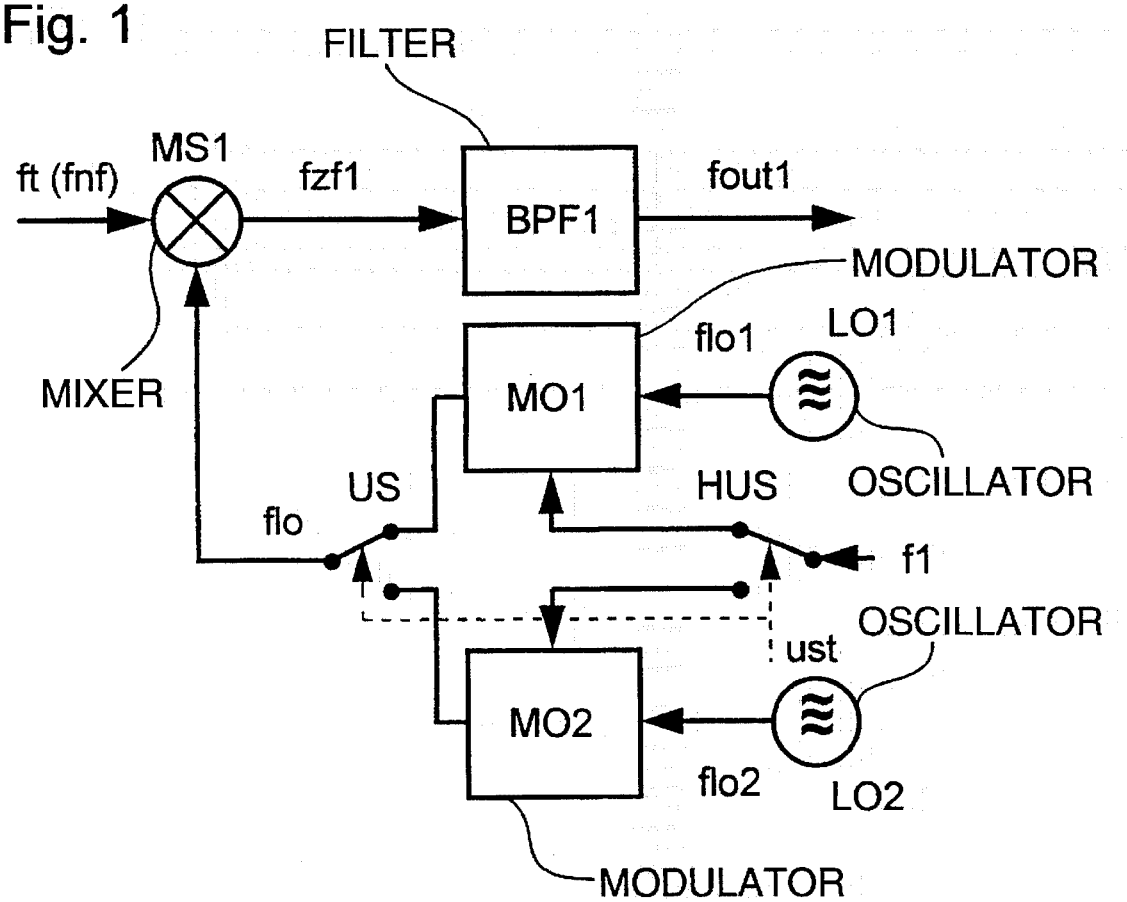
FIG. 1 is a block circuit diagram of a homodyne receiver with auxiliary modulation for the reception of a carrier frequency signal with time-variant carrier frequency.
Figure 2:
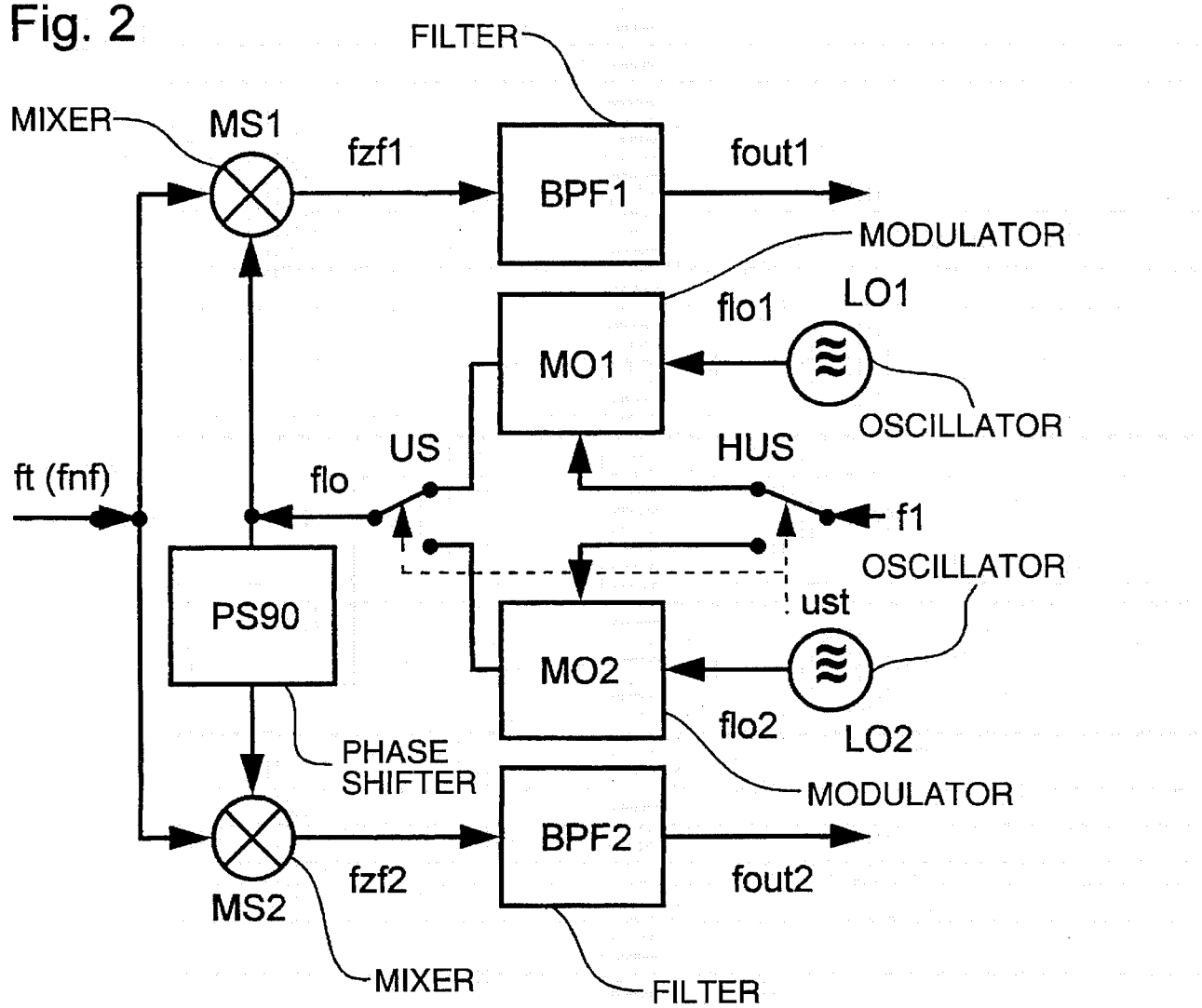
FIG. 2 is a block circuit diagram of a homodyne receiver with auxiliary modulation for the reception of the in-phase and quadrature components of a carrier frequency signal with time-variant carrier frequency.

The homodyne receivers shown in FIGS. 1 through 3 serve for the reception of a carrier frequency signal ft with time-variant carrier frequency modulated with a low-frequency signal fnf and for the conversion of the received signal into the base band. The frequency of the carrier frequency signal ft changes at predetermined points in time known to the receiver. For example, two local oscillators LO1, LO2 that can generate the local oscillator signals flo1, flo2 with the respective carrier frequencies are assumed in these embodiments of the homodyne receiver. When the carrier frequency of the carrier frequency signal ft changes from an original to a new carrier frequency, then a switch must also be made from the local oscillator generating the signal with original carrier frequency, for example the local oscillator LO1, onto the second local oscillator LO2 generating the signal with the new carrier frequency. After the switching event, the first local oscillator LO1 can be readied for generating a signal with the future carrier frequency and the switching event can repeat.

Given the homodyne receiver according to FIG. 1, the first local oscillator LO1 is connected to a first modulator MO1 and supplies the latter with a first local oscillator signal flo1. The same is true of a second local oscillator that is connected to the second modulator MO2 and supplies this with a second local oscillator signal.

An auxiliary signal f1 that is low-frequency compared to the local oscillator signals flo1, flo2 is supplied via an auxiliary switchover HUS to one of the modulators MO1, MO2 connected to the auxiliary switchover HUS. The auxiliary switchover HUS is thereby controlled by the control signal ust. At the times of switching the carrier frequency that are previously known to the receiver, the auxiliary signal f1 is connected onto the modulator, the first modulator MO1 in FIG. 1, by the control voltage ust, a local oscillator signal (the first local oscillator signal flo1) with carrier frequency being supplied to this modulator.

The output of both modulators MO1, MO2 is connected to a respective contact of a switchover US. In the exemplary embodiment, this switchover US is two-stage and is likewise controlled by the control voltage ust. As a result thereof, the switchover US switches synchronously with the auxiliary switchover HUS. The modulation result of one of the two modulators MO1, MO2 is selected and defined as oscillator signal flo by the switching of the switchover US compatible with high-frequency signals. The oscillator signal flo consequently always contains frequency parts of the local oscillator signal with the frequency corresponding to the carrier frequency signal and that is additionally modulated with the auxiliary signal f1.

The realization of a qualitatively high-grade HF-switchover is complicated and cost-intensive. A less complicated embodiment of an HF-switchover is possible due to the auxiliary modulation with the auxiliary signal f1 since the separation of the high-frequency signals of the local oscillators is subjected to lower demands. When, thus, the oscillator signal flo also contains parts of the second local oscillator signal flo2, then this second local oscillator signal flo2 is not modulated with the auxiliary signal f1 and can thus be separated again later. Known problems of the precision of the HF-switchover US, which hitherto resulted in costly realizations of this switchover, are thus avoided. Since the auxiliary switchover HUS that selects the modulator MO1 or MO2 selected by the control signal ust for modulation with the auxiliary signal f1 switches a signal with significantly lower frequencies and frequencies that can also be technologically governed with lower outlay, the second switchover does not cause any significant added economic outlay.

The oscillator signal flo is supplied to an input of a first mixer stage MS1 connected to the switchover US. A second input of the first mixer stage MS1 is connected to an input E of the homodyne receiver that carries the carrier frequency signal ft. For example, this carrier frequency signal ft is the pre-amplified input signal of the receiver means and contains the low-frequency signal fnf, for example a voice signal in a telephone application of the homodyne receiver. The modulation method according to which the low-frequency signal fnf is modulated onto the carrier frequency signal ft is of no consequence for the functioning of the homodyne receiver. For example, phase modulation is a standard modulation method for mobile radiotelephone applications.

A first intermediate frequency signal fzf1 pends at the output of the first mixer stage MS1 as the result of the mixing event in the first mixer stage MS1. Since the frequency of the first local oscillator signal flo1 and the carrier frequency of the carrier frequency signal ft are identical, a conversion of the input signal into the base band is present. After the mixing, the alternating voltage amplitude of the auxiliary signal f1 is proportional to the low-frequency signal fnf and is available as information in the first intermediate frequency signal fzf1. The output of the first mixer stage MS1 is connected to the input of a first band-pass filter BPF1.

The first intermediate frequency signal fzf1 is band-pass filtered in the first band-pass filter BPF1, whereby the first band-pass filter BPF1 is tuned to the frequency of the auxiliary signal f1. The first output signal fout1 present at an output of the first band-pass filter BPF1 thus contains no frequency parts that derive from the local oscillator signals flo1, flo2. All frequency parts except those of the auxiliary signal f1 are removed by the band-pass filtering, as are all d.c. voltage parts. Consequently, a compensation of the d.c. offset is also achieved.

The first output signal fout1 of the homodyne receiver offers a largely noise-free reception signal to further components (not shown) of the receiver circuit for sampling and demodulation. When the further evaluation of the first output signal fout1 is a matter of purely digital selection filters and other digital assemblies, the demands made of the first band-pass filter with respect to satisfying the anti-aliasing condition can be reduced.

Instead of the two local oscillators LO1,LO2 shown in FIG. 1, however, a plurality of local oscillators LO1, . . . LOn corresponding to the number of possible carrier frequencies or some other plurality of local oscillators can be utilized, these at least partly generating a local oscillator signal with a fixed frequency. In this case, the switchover US and the auxiliary switchover HUS are not fashioned in two steps: rather they have a number of stages corresponding to the plurality of local oscillators.

In mobile radiotelephone systems according to the GSM standard or wireless communication systems according to the DECT standard, carrier frequency signals that vary in carrier frequency are employed, so that reception circuits for the reception of such signals with time-variant carrier frequency must be present in both the base and mobile stations. Due to its substantially more cost-beneficial realization, the inventive homodyne receiver is suitable for such mass-production applications.

The homodyne receiver in FIG. 2 represents an expansion of the reception principle explained in FIG. 1 for the reception of a quadrature component in addition to the in-phase component. The oscillator signal flo is generated in the way set forth above and, in addition to being supplied to the first mixer stage MS1, is also supplied to a 90° phase shifter PS90 that is likewise connected to the switchover US. The phase of the oscillator signal flo is turned by 90° in the 90° phase shifter PS90, and the oscillator signal flo modulated in this way is supplied to a second mixer stage MS2. A further input of the second mixer stage MS2 is connected to the input E of the homodyne receiver that carries the carrier frequency signal ft, so that the second intermediate frequency signal fzf2 pends at the output of the second mixer stage MS2.

The output of the second mixer stage MS2 is connected to an input of a second band-pass filter BPF2. Like the first band-pass filter BPF1, this second band-pass filter BPF2 is tuned to the frequency of the auxiliary signal f1. After the band filtering of the second intermediate frequency signal fzf2, consequently, the second band-pass filter BFP2 offers a second output signal fout2 at its output. The amplitude of this second output signal fout2 is proportional to the quadrature component of the carrier frequency signal ft. Like the first output signal fout1, this second output signal fout2 is also sampled and evaluated in further components of the receiver means. However, a complete information in terms of amplitude and phase about the low-frequency signal fnf is now available for the following evaluation with the two output signals fout1, fout2.

The homodyne receiver corresponding to the embodiment in FIG. 3 is based on the homodyne receiver that is described in FIG. 2 but that comprises two modifications. Before the mixing, the carrier frequency signal ft is modulated with a supplemental signal f2 in an additional modulator MOz that likewise belongs to the homodyne receiver. The output of the additional modulator MOz is respectively connected to an input of the first and second mixer stage MS1, MS2 and conducts the result of the modulation to the two mixer stages MS1, MS2.

Among other things, consequently, a signal with a frequency that corresponds to the amount of the frequency difference f3 between the supplemental signal f2 and the auxiliary signal f1 is also available at the output of the two mixer stages MS1 and MS2. The first band-pass filter BPF1 and the second band-pass filter BPF2 are tuned to precisely this frequency f3. A substantial enhancement of the sensitivity of the homodyne receiver can be achieved when the frequencies of the auxiliary signal f1 and the supplemental signal f2 are predetermined such that the frequency difference f3 does not correspond to any other frequency parts directly generated in the homodyne receiver or other devices of the reception means. When the amount of the frequency difference f3 is lower than the frequency of the auxiliary signal f1 and that of the supplemental signal f2, internal disturbances due to harmonics of the mixed signals are also eliminated.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for reducing spurious reception locations in homodyne receivers having time-variant carrier frequency,
   receiving a carrier frequency signal that has a time-variant carrier frequency;
   selecting a local oscillator signal for derivation of a receiver oscillator signal by a switch device, a frequency of the selected local oscillator signal corresponding to the present carrier frequency of the carrier frequency signal;
   deriving the receiver oscillator signal by modulation of the selected local oscillator signal with an auxiliary signal;
   mixing the received carrier frequency signal with the receiver oscillator signal to form a first intermediate frequency signal; and
   band-pass filtering the first intermediate frequency signal corresponding to a frequency allocated to the auxiliary signal.

2. The method according to claim 1, wherein the method further comprises:
   mixing the received carrier frequency signal with the receiver oscillator signal, that is allocatable to the current carrier frequency and that is phase-shifted by 90°, to form a second intermediate frequency signal; and
   band-pass filtering the second intermediate frequency signal corresponding to a frequency allocated to the auxiliary signal.

3. The method according to claim 2, wherein the filtering of the first and second intermediate frequency signals is respectively tuned to the frequency of the auxiliary signal.

4. The method according to claim 1, wherein the auxiliary signal for the modulation of the selected local oscillator signal is supplied via an additional switch device synchronously with the selection of the local oscillator signal.

5. The method according to claim 1, wherein the carrier frequency signal is modulated with a supplemental signal before the mixing, and wherein the band-pass filtering of the intermediate frequency signal is respectively tuned to a frequency difference between the frequency of the supplemental signal and the frequency of the auxiliary signal.

6. The method according to claim 5, wherein the frequency of the supplemental signal is selected such that the frequency of the frequency difference is lower than the frequency of the supplemental signal and the frequency of the auxiliary signal and corresponds to no frequency generated in the homodyne receiver.

7. The method according to claim 1, wherein the frequency of the auxiliary signal, that is between the frequency of the low-frequency signal and the frequency of the carrier frequency signal, is tuned to a frequency for which economically realizable switchovers and filters are realizable.

8. A homodyne receiver for reducing spurious reception locations during reception of a carrier frequency signal having a time-variant carrier frequency modulated with a low-frequency signal, comprising:
   first and second mixer stages having input sides respectively connected to an input of the homodyne receiver and to a switchover device either directly or, respectively, via a 90° phase shifter;
   the switchover, which is controlled by a control signal, selecting a local oscillator that generates a local oscillator signal corresponding to the carrier frequency of the carrier frequency signal for connection to the first mixer stage and to the 90° phase shifter;
   the carrier frequency signal being mixed in the first mixer stage with an oscillator signal allocatable to the respective carrier frequency and one of the local oscillator signals, and the carrier frequency signal being mixed in the second mixer stage with the oscillator signal shifted by 90° in the 90° phase shifter to form respective first and second intermediate frequency signals at respective outputs of the mixer stages;

the switchover being connected to each local oscillator via a respective modulator for modulation of the local oscillator signal, corresponding to a present carrier frequency, with an auxiliary signal to form the oscillator signal;

an additional auxiliary switchover for supplying the auxiliary signal to the modulator that presently is connected to the switchover; and the output of the first mixer stage connected to an input of a first band-pass filter and the output of the second mixer stage connected to an input of a second band-pass filter;

wherein the band-pass filters are respectively tuned corresponding to a frequency allocatable to the auxiliary signal such that a signal proportional to a real part of the low-frequency signal pends at an output of the first band-pass filter and a signal proportional to an imaginary part of the low-frequency signal pends at the output of the second band-pass filter.

9. The homodyne receiver according to claim 8, wherein the auxiliary signal for the modulation of the allocated local oscillator signal is connected by the auxiliary switchover, which is controlled by the control signal, synchronously with the selection of the local oscillator signal.

10. The homodyne receiver according to claim 8, wherein the band-pass filters for the band-filtering of the first and second intermediate frequency signal are tuned to the frequency of the auxiliary signal.

11. The homodyne receiver according to claim 8, wherein the input of the homodyne radio receiver corresponds to the output of an additional modulator in the homodyne radio receiver;

wherein the carrier frequency signal is modulated with a supplemental signal before mixing in the first and second mixer stages; and wherein the band-pass filters for the band-filtering of the first and second intermediate frequency signal are tuned to a frequency difference between the frequencies of the supplemental signal and of the auxiliary signal.

12. The homodyne receiver according claim 11, wherein the frequency of the auxiliary signal and the frequency of the supplemental signal are selected such that the frequency of the frequency difference is lower than the frequency of the supplemental signal and the frequency of the auxiliary signal and corresponds to no other frequency part generated in the homodyne receiver.

13. The homodyne receiver according to claim 8, wherein the frequency of the auxiliary signal, which is between the frequency of the low-frequency signal and the frequency of the frequency carrier frequency signal is defined to be within a frequency range of modulators and band-pass filters that are simply and cost-beneficially realizable.

14. The homodyne receiver according to claim 8, wherein the switchover is fashioned as a two-stage switchover; and wherein the switchover selects between two local oscillators connected to the switchover via a respective modulator, the selected local oscillator generating the present carrier frequency and the other local oscillator being tuned to a next-successive carrier frequency.

15. A method for reducing spurious reception locations in homodyne receivers comprising the steps of:

receiving a carrier frequency signal that has a time-variant carrier frequency modulated with a low-frequency signal;

selecting a local oscillator signal for derivation of a receiver oscillator signal by a switch device, a frequency of the selected local oscillator signal corresponding to the present carrier frequency of the carrier frequency signal;

deriving the receiver oscillator signal by modulation of the selected local oscillator signal with an auxiliary signal;

mixing the received carrier frequency signal with the receiver oscillator signal to form a first intermediate frequency signal;

band-pass filtering the first intermediate frequency signal corresponding to a frequency allocated to the auxiliary signal;

mixing the received carrier frequency signal with the receiver oscillator signal, that is allocatable to the current carrier frequency and that is phase-shifted by 90°, to form a second intermediate frequency signal; and band-pass filtering the second intermediate frequency signal corresponding to a frequency allocated to the auxiliary signal.

16. The method according to claim 15, wherein the auxiliary signal for the modulation of the selected local oscillator signal is supplied via an additional switch device synchronously with the selection of the local oscillator signal.

17. The method according to claim 15, wherein the filtering of the first and second intermediate frequency signals is respectively tuned to the frequency of the auxiliary signal.

18. The method according to claim 15, wherein the carrier frequency signal is modulated with a supplemental signal before the mixing, and wherein the band-pass filtering of the intermediate frequency signal is respectively tuned to a frequency difference between the frequency of the supplemental signal and the frequency of the auxiliary signal.

19. The method according to claim 18, wherein the frequency of the supplemental signal is selected such that the frequency of the frequency difference is lower than the frequency of the supplemental signal and the frequency of the auxiliary signal and corresponds to no frequency generated in the homodyne receiver.

20. The method according to claim 15, wherein the frequency of the auxiliary signal, that is between the frequency of the low-frequency signal and the frequency of the carrier frequency signal is tuned to a frequency for which economically realizable switchovers and filters are realizable.

* * * * *